(12) United States Patent
Song

(10) Patent No.: US 8,804,443 B2
(45) Date of Patent: Aug. 12, 2014

(54) SEMICONDUCTOR MEMORY DEVICE

(75) Inventor: Choung-Ki Song, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 248 days.

(21) Appl. No.: 13/478,805

(22) Filed: May 23, 2012

(65) Prior Publication Data

US 2013/0163354 A1 Jun. 27, 2013

(30) Foreign Application Priority Data

Dec. 21, 2011 (KR) .......................... 10-2011-0139538

(51) Int. Cl.
*G11C 7/00* (2006.01)

(52) U.S. Cl.
USPC .................. 365/194; 365/230.06; 365/233.1; 365/189.07

(58) Field of Classification Search
CPC .. G11C 7/109; G11C 7/1066; G11C 11/4076; G11C 8/18
USPC ...................... 365/194, 230.06, 233.1, 189.07
See application file for complete search history.

(56) References Cited

U.S. PATENT DOCUMENTS

| | | | | |
|---|---|---|---|---|
| 6,104,653 | A | * | 8/2000 | Proebsting .................... 365/203 |
| 6,166,990 | A | * | 12/2000 | Ooishi et al. ............. 365/233.11 |
| 8,121,237 | B2 | * | 2/2012 | Stott et al. ...................... 365/193 |
| 2003/0198121 | A1 | * | 10/2003 | Kuroda .................... 365/230.05 |
| 2014/0016404 | A1 | * | 1/2014 | Kim et al. ..................... 365/158 |

FOREIGN PATENT DOCUMENTS

| | | |
|---|---|---|
| KR | 1020040086168 | 10/2004 |
| KR | 1020060023304 | 3/2006 |

* cited by examiner

*Primary Examiner* — Tuan T Nguyen
(74) *Attorney, Agent, or Firm* — IP & T Group LLP

(57) ABSTRACT

A semiconductor memory device includes a command delay section configured to delay a command signal applied through a command input pad by a parity delay amount in synchronization with an operating clock and output a parity command signal in a parity operation mode, wherein the command delay section is further configured to be controlled in response to an error determination signal, a command decoder configured to decode the parity command signal and transfer a resultant signal to a plurality of memory banks, and an error determination unit configured to determine whether an error has occurred in the command signal and generate an error determination signal.

26 Claims, 10 Drawing Sheets

SEMICONDUCTOR MEMORY DEVICE

CROSS-REFERENCE TO RELATED APPLICATIONS

The present application claims priority of Korean Patent Application No. 10-2011-0139538, filed on Dec. 21, 2011, which is incorporated herein by reference in its entirety.

BACKGROUND

1. Field

Exemplary embodiments of the present invention relate to semiconductor design technology, and more particularly, to a semiconductor memory device that can support a parity operation mode.

2. Description of the Related Art

FIG. 1 is a block diagram illustrating a layout of a plurality of banks and peripheral regions in a conventional semiconductor memory device.

Referring to FIG. 1, a conventional semiconductor memory device includes a plurality of banks BANK0, BANK1, BANK2, and BANK3 and peripheral regions DQPERI and ACPERI.

The plurality of banks BANK0, BANK1, BANK2, and BANK3 store data and, as shown in FIG. 1, occupy more circuit area than the peripheral regions DQPERI and ACPERI. The plurality of banks BANK0, BANK1, BANK2, and BANK3 are disposed symmetrically with respect to one another and respectively occupy the corners of the semiconductor memory device.

The first peripheral region DQPERI is disposed on the semiconductor memory device between the first and second banks BANK0 and BANK1, and the second peripheral region ACPERI is disposed on the semiconductor memory device between the third and fourth banks BANK2 and BANK3. The first peripheral region DQPERI includes circuits involved in data input/output operations, and the second peripheral region ACPERI includes circuits involved in control operations of the semiconductor memory device. In addition, the semiconductor memory device includes a plurality of pads. The pads may include a data input/output pad (DQ), a command input pad (CMD_PAD), and an address input pad (ADDR_PAD).

Furthermore, a clock input pad CLK_PAD is disposed at the center of the semiconductor memory device such that the clock input pad CLK_PAD is positioned at a first distance from the plurality of respective banks BANK0, BANK1, BANK2, and BANK3. The position of the clock input pad CLK_PAD is to prevent the occurrence of a skew when an operating clock CLK inputted through the clock input pad CLK_PAD is transferred to the plurality of respective banks BANK0, BANK1, BANK2, and BANK3.

FIG. 2 is a block diagram illustrating a detailed layout of a clock input pad and a second peripheral region in the conventional semiconductor memory device shown in FIG. 1.

Among the component elements of the conventional semiconductor memory device, the dock input pad CLK_PAD is positioned at the center of the semiconductor memory device at the first distance from the plurality of respective banks BANK0, BANK1, BANK2, and BANK3, and the second peripheral region ACPERI is defined on the right side of the clock input pad CLK_PAD. Referring to FIG. 2, the clock input pad CLK_PAD and the second peripheral region ACPERI are illustrated, and as an example, the clock input pad CLK_PAD is illustrated to the left of the command input pad CMD_PAD.

In detail, in the second peripheral region ACPERI, a command input pad CMD_PAD and a command decoder 240 are disposed most adjacent to the clock input pad CLK_PAD. Accordingly, the command input pad CMD_PAD and the command decoder 240 are positioned at the first distance from the plurality of respective banks BANK0, BANK1, BANK2, and BANK3.

Because the command input pad CMD_PAD and the command decoder 240 are positioned most adjacent to the clock input pad CLK_PAD, which is positioned at the center of the semiconductor memory device, the occurrence of a skew may be prevented when a command signal EXT_CMD_SIG applied through the command input pad CMD_PAD is decoded through the command decoder 240 and subsequently a resultant signal DEC_CMD_SIG is transferred to the plurality of respective banks BANK0, BANK1, BANK2, and BANK3.

For reference, since a procedure that outputs the command signal EXT_CMD_SIG as an internal command signal INT_CMD_SIG is performed in synchronization with the operating clock CLK, as shown in the drawing, a flip-flop F/F for outputting the external command signal EXT_CMD_SIG as the internal command signal INT_CMD_SIG in response to the operating clock CLK is provided between the command input pad CMD_PAD and the command decoder 240. The external command signal EXT_CMD_SIG and the internal command signal INT_CMD_SIG are substantially the same signal except that the internal command signal INT_CMD_SIG is synchronized with the operating clock CLK. Therefore, unless it is necessary to distinguish the internal command signal INT_CMD_SIG and the external command signal EXT_CMD_SIG from each other, the internal command signal INT_CMD_SIG and the external command signal EXT_CMD_SIG will not be distinguished from each other in the following descriptions and will be referred to as a command signal INT_CMD_SIG.

As shown in FIG. 2, an address input pad ADDR_PAD in the second peripheral region ACPERI is disposed on the right side of the command input pad CMD_PAD such that the address input pad ADDR_PAD is positioned closer than the first distance to the third and fourth banks BANK2 and BANK3 among the plurality of banks BANK0, BANK1, BANK2, and BANK3 and further than the first distance from the first and second banks BANK0 and BANK1.

Accordingly, when an address signal EXT_ADDR_SIG is inputted through the address input pad ADDR_PAD and is transferred to the plurality of banks BANK0, BANK1, BANK2, and BANK3, a time that elapses for transferring the address signal EXT_ADDR_SIG to the third and fourth banks BANK2 and BANK3 among the plurality of banks BANK0, BANK1, BANK2, and BANK3 is different than a time that elapses for transferring the address signal EXT_ADDR_SIG to the first and second banks BANK0 and BANK1.

Even when the time that elapses for transferring the address signal EXT_ADDR_SIG to the plurality of banks BANK0, BANK1, BANK2, and BANK3 may be different, no substantial issues are caused in the operation of the semiconductor memory device because the plurality of banks BANK0, BANK1, BANK2, and BANK3 respectively have separate address decoders (not shown) for decoding the address signal EXT_ADDR_SIG.

For reference, since a procedure that outputs the address signal EXT_ADDR_SIG as an internal address signal INT_ADDR_SIG is performed in synchronization with the operating clock CLK, as shown in the drawing, flip-flops F/F for outputting the external address signal EXT_ADDR_SIG as the internal address signal INT_ADDR_SIG in response to the operating clock CLK are provided over the address input pad ADDR_PAD. The external address signal EXT_ADDR_SIG and the internal address signals INT_ADDR_SIG are substantially the same signal except that the internal address signals INT_ADDR_SIG are synchronized with the operating clock CLK. Therefore, unless it is necessary to distinguish the internal address signal INT_ADDR_SIG and the external address signal EXT_ADDR_SIG from each other, the internal address signal INT_ADDR_SIG and the external address signal EXT_ADDR_SIG will not be distinguished from each other in the following descriptions and will be referred to as an address signal INT_ADDR_SIG.

As shown in FIG. 2, the number of flip-flops F/F provided over the address input pad ADDR_PAD is greater than the number of flip-flop F/F provided over the command input pad CMD_PAD. The difference in the number of flip-flops F/F occurs because the bit number of the address signal INT_ADDR_SIG applied through the address input pad ADDR_PAD is significantly greater than the bit number of the command signal INT_CMD_SIG inputted through the command input pad CMD_PAD, and accordingly, the area occupied by the address input pad ADDR_PAD is larger than the area occupied by the command input pad CMD_PAD.

Meanwhile, in the conventional semiconductor memory device described above with reference to FIGS. 1 and 2, a parity operation component element for detecting an error occurring in the command signal INT_CMD_SIG applied through the command input pad CMD_PAD and for controlling the operation of the semiconductor memory device is not included. Thus, in the event that the error occurs in the command signal INT_CMD_SIG applied through the command input pad CMD_PAD, the semiconductor memory device is likely to perform an erroneous operation as the semiconductor memory device operates with the erroneous command signal INT_CMD_SIG.

SUMMARY

An embodiment of the present invention is directed to a semiconductor memory device that can internally support a parity operation mode.

In accordance with an embodiment of the present invention, a semiconductor memory device includes: a command delay section configured to delay a command signal applied through a command input pad by a parity delay amount in synchronization with an operating clock and output a parity command signal in a parity operation mode, wherein the command delay section is further configured to be controlled in response to an error determination signal; a command decoder configured to decode the parity command signal and transfer a resultant signal to a plurality of memory banks; and an error determination unit configured to determine whether an error has occurred in the command signal and generate an error determination signal. The command delay section, the command decoder, and the command input pad are disposed adjacent to one another and disposed at a first distance from the plurality of respective memory banks, and the address delay section, the error determination unit, and the address input pad are disposed adjacent to one another and disposed closer than the first distance to a first group memory banks of the plurality of banks and further than the first distance from a second group of memory banks not included in the first group.

In accordance with another embodiment of the present invention, a semiconductor memory device includes: a command delay section configured to delay a command signal applied through a command input pad by a parity delay amount in synchronization with an operating clock and output a parity command signal in a parity operation mode, wherein the command delay section is further configured to be controlled in response to an error determination signal; a command decoder configured to decode the parity command signal and transfer a resultant signal to a plurality of memory banks; and an error determination unit configured to determine whether an error has occurred in the command signal and generate an error determination signal. The semiconductor memory device further includes: an address delay section configured to delay an address signal applied through an address input pad by the parity delay amount and output a parity address signal in the parity operation mode, wherein the address delay section is controlled in response to the error determination signal. The command input pad is disposed at a first distance from the plurality of respective memory banks, and the command delay section, the command decoder, the address delay section, the error determination unit, and the address input pad are disposed adjacent to one another and disposed closer than the first distance to a first group of memory banks of the plurality of memory banks and further than the first distance from a second group of memory banks not included in the first group.

In accordance with yet another embodiment of the present invention: a command delay section configured to delay a command signal applied through a command input pad by a parity delay amount in synchronization with an operating clock and output a parity command signal in a parity operation mode, wherein the command delay section is further configured to be controlled in response to an error determination signal; a command decoder configured to decode the parity command signal and transfer a resultant signal to a plurality of memory banks; and an error determination unit configured to determine whether an error has occurred in the command signal and generate an error determination signal. The semiconductor memory device further includes: an address delay section configured to delay an address signal applied through an address input pad by the parity delay amount and output a parity address signal in the parity operation mode, wherein the address delay section is controlled in response to the error determination signal. The command delay section, the command decoder, the address delay section, the error determination unit, and the command input pad are disposed adjacent to one another and disposed at a first distance from the plurality of respective memory banks, and the address input pad is disposed closer than the first distance to a first group of memory banks of the plurality of memory banks and further than the first distance from a second group of memory banks not included in the first group.

DETAILED DESCRIPTION

Figure 1:
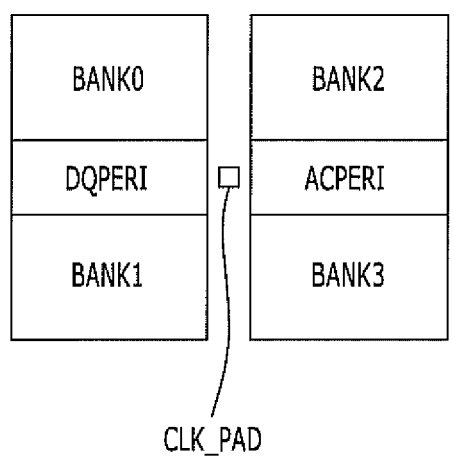
FIG. 1 is a block diagram illustrating a layout of a plurality of banks and peripheral regions in a conventional semiconductor memory device.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

First Embodiment

Figure 3:
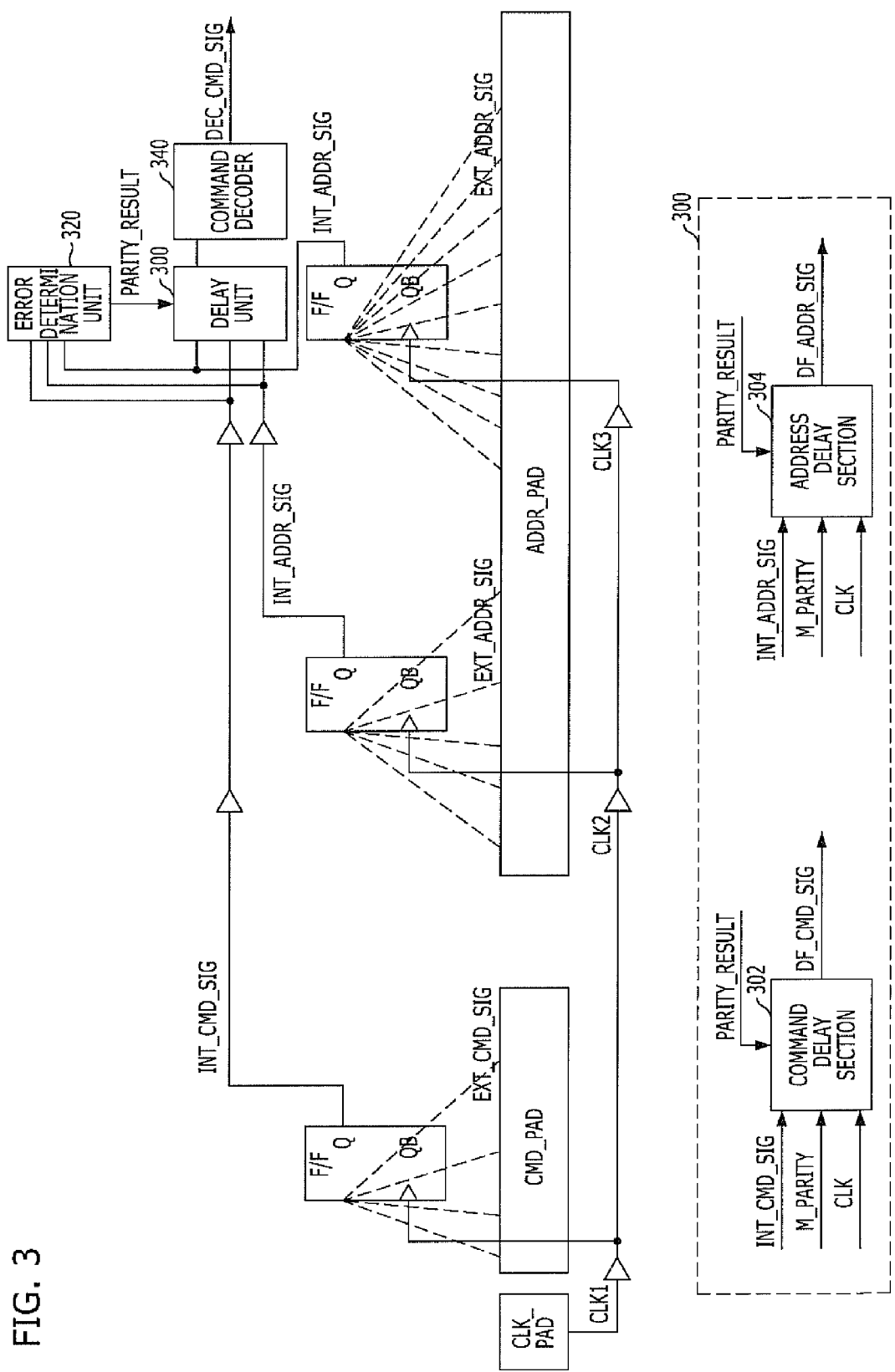
FIG. 3 is a block diagram illustrating a detailed layout of a clock input pad and a second peripheral region in a semiconductor memory device that supports a parity operation in accordance with a first embodiment of the present invention.

FIG. 3 is a block diagram illustrating a detailed layout of a clock input pad and a second peripheral region in a semiconductor memory device that supports a parity operation in accordance with a first embodiment of the present invention.

Figure 4:
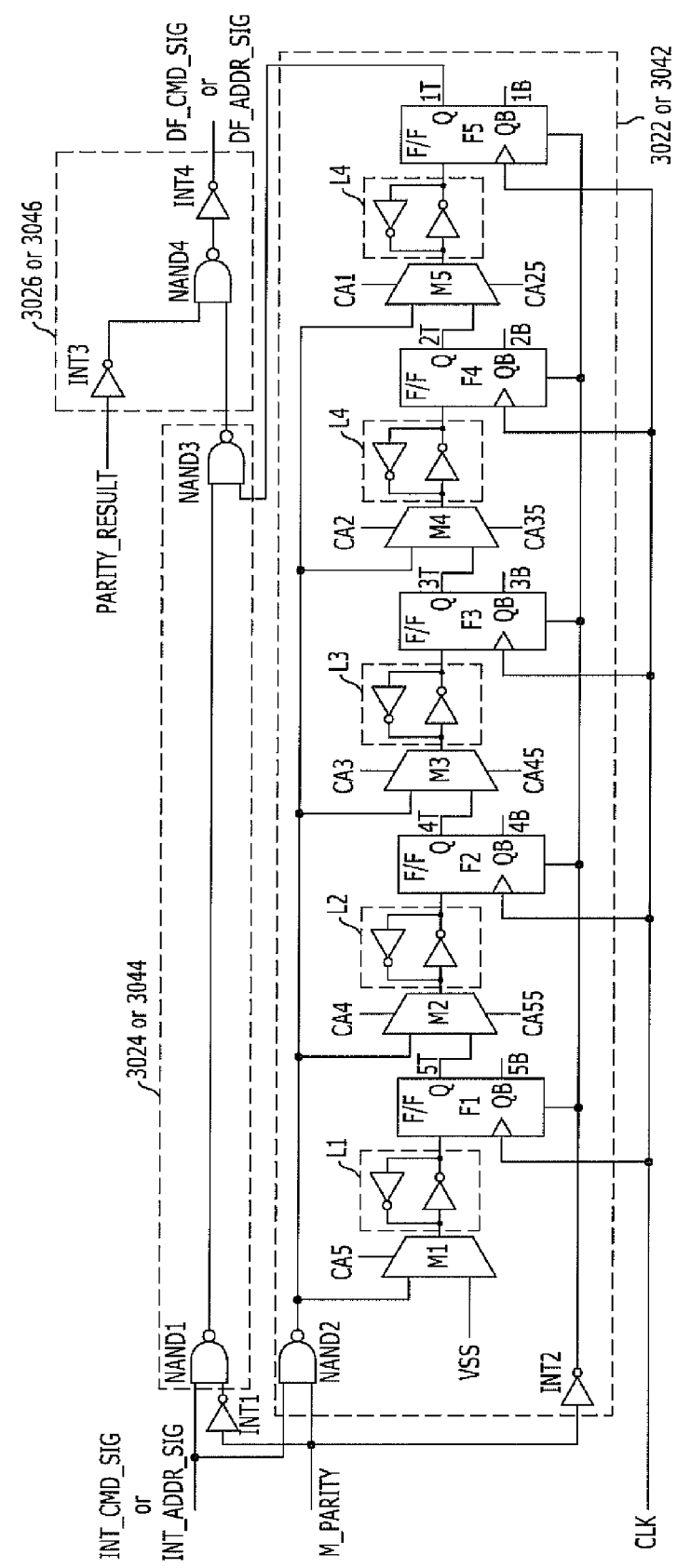
FIG. 4 is a circuit diagram illustrating in detail a command delay section and an address delay section among the component elements of the semiconductor memory device that supports a parity operation in accordance with the first embodiment of the present invention shown in FIG. 3.

FIG. 4 is a circuit diagram illustrating in detail a command delay section and an address delay section among the component elements of the semiconductor memory device that supports a parity operation in accordance with the first embodiment of the present invention shown in FIG. 3.

Figure 5:
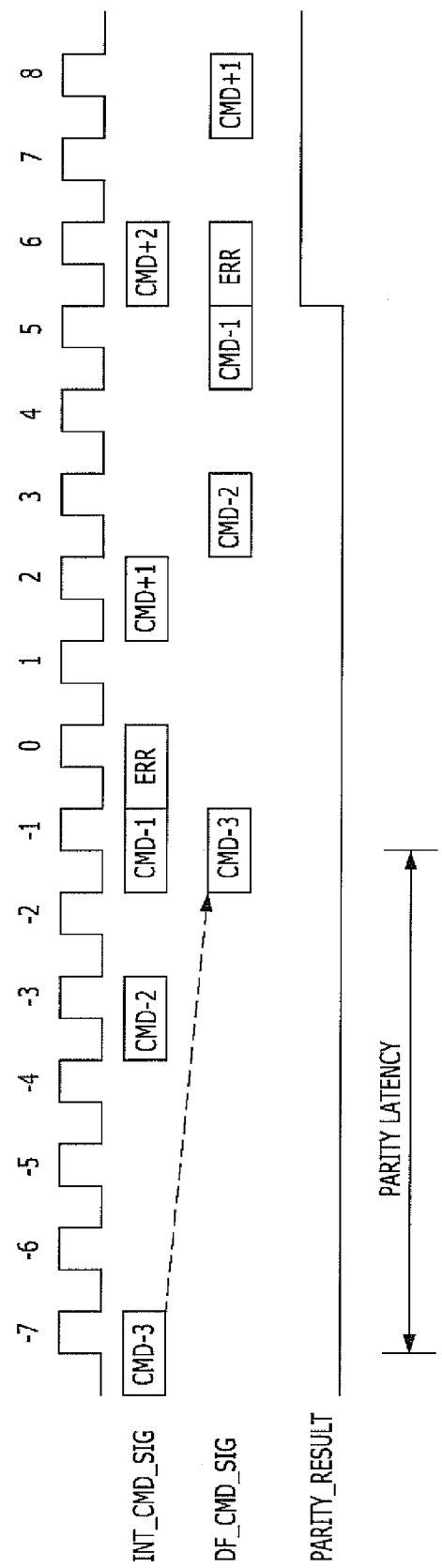
FIG. 5 is a timing diagram illustrating operations of the semiconductor memory device that supports a parity operation in accordance with the first embodiment of the present invention shown in FIG. 3.

FIG. 5 is a timing diagram illustrating operations of the semiconductor memory device that supports a parity operation in accordance with the first embodiment of the present invention shown in FIG. 3.

Figure 2:
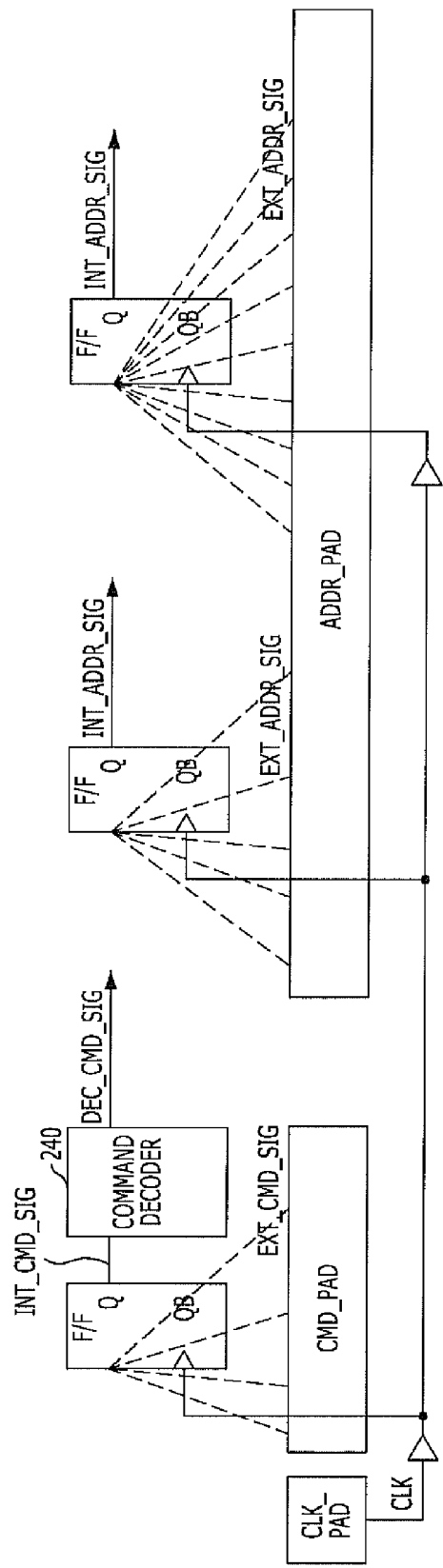
FIG. 2 is a block diagram illustrating a detailed layout of a clock input pad and a second peripheral region in the conventional semiconductor memory device shown in FIG. 1.

In the semiconductor memory device in accordance with the first embodiment of the present invention, the layout configuration between a plurality of banks BANK0, BANK1, BANK2, and BANKS and peripheral regions DQPERI and ACPERI are the same as shown in FIG. 1. However, shown in FIG. 3, the layout configuration between a clock input pad CLK_PAD and the second peripheral region ACPERI is different from that shown in FIG. 2.

Furthermore, as explained above, unless it is necessary to distinguish an internal command signal INT_CMD_SIG and an external command signal EXT_CMD_SIG from each other, the internal command signal INT_CMD_SIG and the external command signal EXT_CMD_SIG will not be distinguished from each other in the following descriptions and will be referred to as a command signal INT_CMD_SIG. Similarly, unless it is necessary to specifically distinguish an internal address signal INT_ADDR_SIG and an external address signal EXT_ADDR_SIG from each other, the internal address signal INT_ADDR_SIG and the external address signal EXT_ADDR_SIG will not be distinguished from each other in the following descriptions and will be referred to as an address signal INT_ADDR_SIG.

Referring to FIG. 3, the semiconductor memory device that supports a parity operation in accordance with the first embodiment of the present invention includes a clock input pad CLK_PAD, a command input pad CMD_PAD, an address input pad ADDR_PAD, an error determination unit 320, a delay unit 300, and a command decoder 340.

The delay unit 300 includes a command delay section 302 and an address delay section 304.

The command delay section 302 is configured to delay the command signal INT_CMD_SIG applied through the command input pad CMD_PAD by a first parity delay amount in synchronization with an operating clock CLK and output a parity command signal DF_CMD_SIG in a parity operation mode. The parity operation mode may be a period in which a signal M_PARITY is activated. The operation of the command delay section 302 is controlled in response to an error determination signal PARITY_RESULT.

Also, the command delay section 302 is configured to output the command signal INT_CMD_SIG applied through the command input pad CMD_PAD without delaying the command signal INT_CMD_SIG and output the parity command signal DF_CMD_SIG in a normal operation mode. The normal operation mode may be a period in which the signal M_PARITY is deactivated. More specifically, in the normal operation mode, the command delay section 302 does not perform any operation on the command signal INT_CMD_SIG.

The address delay section 304 is configured to delay the address signal INT_ADDR_SIG applied through the address input pad ADDR_PAD by a second parity delay amount in synchronization with the operating clock CLK and output a parity address signal DF_ADDR_SIG in the parity operation mode. The operation of the address delay section 304 is controlled in response to the error determination signal PARITY_RESULT.

Also, the address delay section 304 is configured to output the address signal INT_ADDR_SIG applied through the address input pad ADDR_PAD without delaying the address signal INT_ADDR_SIG and output the parity address signal DF_ADDR_SIG in the normal operation mode. More specifically, in the normal operation mode, the address delay section 304 does not perform any operation on the address signal INT_ADDR_SIG.

The command decoder 340 is configured to decode the parity command signal DFCMD_SIG outputted from the command delay section 302 and transfer a resultant signal DEC-CMD_SIG to the plurality of respective banks BANK0, BANK1, BANK2, and BANK3.

The error determination unit 320 is configured to determine whether or not an error has occurred in a plurality of command signals INT_CMD_SIG sequentially applied through the command input pad CMD_PAD and is further configured to decide whether or not to activate the error determination signal PARITY_RESULT. In detail, the error determination unit 320 is configured to receive the address signal INT_ADDR_SIG applied through the address input pad ADDR_PAD and the command signal INT_CMD_SIG applied through the command input pad CMD_PAD and determine whether or not an error has occurred through an error checking operation. The error determination signal PARITY_RESULT, which is activated when an error has occurred, is not synchronized with the operating clock CLK. Since an algorithm for determining whether an error has occurred in the command signal INT_CMD_SIG is known in the art, detailed description thereof will be omitted.

Referring to FIG. 4, detailed circuit configurations of the command delay section 302 and the address delay section 304 are illustrated.

In detail, the command delay section 302 includes a stepwise command delay stage 3022, a command bypass stage 3024, and a command output control stage 3026. The stepwise command delay stage 3022 is configured to delay the plurality of command signals INT_CMD_SIG sequentially applied through the command input pad CMD_PAD by parity delay amounts in a stepwise FIFO (first in first out) pattern corresponding to the toggling of the operating clock CLK in the parity operation mode. The command bypass stage 3024 is configured to bypass the command signals INT_CMD_SIG applied through the command input pad CMD_PAD in the normal operation mode. In addition, the command output control stage 3026 is configured to cause the parity command signal DF_CMD_SIG to have a designated value regardless of the value of the signal outputted from the stepwise command delay stage 3022 in response to the error determination signal PARITY_RESULT.

The stepwise command delay stage 3022 includes a plurality of command delay flip-flops F1, F2, F3, F4, and F5, command input selection parts, and a plurality of command latches L1, L2, L3, L4 and L5. The plurality of command delay flip-flops F1, F2, F3, F4, and F5 delay the signals by one cycle 1tck each, output resultant signals, and are connected in a chain type. The command input selection parts M1, M2, M3, M4, and M5 apply the plurality of command signals INT_CMD_SIG to any one of the plurality of command delay flip-flops F2, F3, F4, and F5 in response to parity delay amount setting signals CA5, CA4, CA3, CA2, and CA1. The plurality of command latches L1, L2, L3, L4, and L5 are respectively connected to the input terminals of the plurality of command delay flip-flops F1, F2, F3, F4, and F5 and latch the signals applied thereto through the command input selection parts M1, M2, M3, M4, and M5. Moreover, the stepwise command delay stage 3022 further includes a NAND gate NAND2 and an inverter INT2. The NAND gate NAND2 and the inverter INT2 are configured to enable the plurality of command delay flip-flops F1, F2, F3, F4, and F5, the plurality of command input selection parts M1, M2, M3, M4, and M5, and the plurality of command latches L1, L2, L3, L4, and L5 in the parity operation mode and disable the plurality of command delay flip-flops F1, F2, F3, F4, and F5, the plurality of command input selection parts M1, M2, M3, M4, and M5, and the plurality of command latches L1, L2, L3, L4 and L5 in the normal operation mode.

The command bypass stage 3024 includes a first NAND gate NAND1 and a second NAND gate NAND3. The first NAND gate NAND1 transfers the command signal INT_CMD_SIG in the normal operation mode and outputs a signal activated to a logic high level regardless of the command signal INT_CMD_SIG in the parity operation mode. The second NAND gate NAND3 receives the output signal of the first NAND gate NAND1 and the output signal of the step-wise command delay stage 3022, performs a NAND operation, and outputs a resultant signal to the command output control stage 3026.

The command output control stage 3026 includes a NAND gate NAND4, a first inverter INT3, and a second inverter INT4. The NAND gate NAND4 receives the inverted error determination signal PARITY_RESULT, which is inverted by the first inverter INT3, and the output signal of the command bypass stage 3024, performs a NAND operation on the received signals, and outputs a resultant signal. The second inverter INT4 inverts the resultant signal from the NAND gate NAND4, inverts the resultant signal from the NAND gate NAND4, and outputs the parity command signal DF_CMD_SIG.

The address delay section 304 includes a stepwise address delay stage 3042, a command bypass stage 3044, and a command output control stage 3046. The stepwise command delay stage 3042 is configured to delay the plurality of address signals INT_ADDR_SIG sequentially applied through the address input pad ADDR_PAD by parity delay amounts in a stepwise FIFO (first in first out) pattern corresponding to the toggling of the operating clock CLK in the parity operation mode. The address bypass stage 3044 is configured to output the address signals INT_ADDR_SIG applied through the address input pad ADDR_PAD in the normal operation mode. In addition, the command output control stage 3046 is configured to cause the parity address signal DF_ADDR_SIG to have a designated value regardless of the value of the signal outputted from the stepwise address delay stage 3042 in response to the error determination signal PARITY_RESULT.

The stepwise address delay stage 3042 includes a plurality of address delay flip-flops F1, F2, F3, F4, and F5, address input selection parts M1, M2, M3, M4, and M5, and a plurality of address latches L1, L2, L3, L4, and L5. The plurality of command delay flip-flops F1, F2, F3, F4, and F5 delay the signals by one cycle lick each, output resultant signals, and are connected in a chain type. The command input selection parts M1, M2, M3, M4 and M5 apply the plurality of command signals INT_CMD_SIG to any one of the plurality of command delay flip-flops F1, F2, F3, F4, and F5 in response to parity delay amount setting signals CA5, CA4, CA3, CA2, and CA1. The plurality of command latches L1, L2, L3, L4 and L5 are respectively connected to the input terminals of the plurality of command delay flip-flops F1, F2, F3, F4, and F5 and latch the signals applied thereto through the command input selection parts M1, M2, M3, M4, and M5. Moreover, the stepwise address delay stage 3042 further includes a NAND gate NAND2 and an inverter INT2. The NAND gate NAND2 and the inverter INT2 are configured to enable the plurality of address delay flip-flops F1, F2, F3, F4, and F5, the plurality of address input selection parts M1, M2, M3, M4, and M5, and the plurality of address latches L1, L2, L3, L4, and L5 in the parity operation mode and disable the plurality of address delay flip-flops F1, F2, F3, F4, and F5, the plurality of address input selection parts M1, M2, M3, M4, and M5, and the plurality of address latches L1, L2, L3, L4, and L5 in the normal operation mode.

The address bypass stage 3044 includes a first NAND gate NAND1 and a second NAND gate NAND3. The first NAND gate NAND1 transfers the command signal INT_CMD_SIG as it is in the normal operation mode and outputs a signal activated to a logic high level regardless of the command signal INT_CMD_SIG in the parity operation mode. The second NAND gate NAND3 receives the output signal of the first NAND gate NAND1 and the output signal of the stepwise command delay stage 3022, performs a NAND operation, and outputs a resultant signal to the command output control stage 3026.

The address output control stage 3046 includes a NAND gate NAND4, a first inverter INT3, and a second inverter INT4. The NAND gate NAND4 receives the inverted error determination signal PARITY_RESULT, which is inverted by the first inverter INT3, and the output signal of the command bypass stage 3024, performs a NAND operation on the received signals, and outputs a resultant signal. The second inverter INT4 receives the resultant signal from the NAND gate NAND4, inverts the resultant signal from the NAND gate NAND4, and outputs the parity command signal DF_CMD_SIG.

For reference, the values of the parity delay amount setting signals CA5, CA4, CA3, CA2, and CA1 may be set by a designer through a component element, which may be included in a semiconductor memory device, such as a memory register set (MRS). In other words, the parity delay amounts of the command delay section 302 and the address delay section 304 may be set by a designer.

Referring to FIG. 5, operations of the semiconductor memory device that support a parity operation in accordance with the first embodiment of the present invention are illustrated.

In detail, if the parity operation mode is entered, the command delay section 302 delays the command signal INT_CMD_SIG by the parity delay amount and outputs the parity command signal DF_CMD_SIG.

As shown in FIG. 5, as the command signal INT_CMD_SIG and a plurality of commands CMD−3, CMD−2, CMD−1, CMD+1, and CMD+2 are sequentially inputted, and the parity command signal DF_CMD_SIG, a plurality of commands CMD−3, CMD−2, CMD−1, CMD+1, and CMD+2 are sequentially generated.

At this time, the command applied next to the command CMD-1 thirdly applied among the plurality of commands CMD−3, CMD−2, CMD−1, CMD+1, and CMD+2 becomes an error command ERR. Therefore, the error determination unit 320 detects the command, determines that the command is the error command ERR, and activates the error determination signal PARITY_RESULT from a logic low level to a logic high level at the point in time when the error command ERR is outputted as the parity command signal DF_CMD_SIG. In this way, the error determination unit 320 detects that a command input error has occurred in the semiconductor memory device.

As described above, the semiconductor memory device in accordance with the first embodiment of the present invention shown in FIGS. 3 to 5 may support the parity operation. As a consequence, when the error command ERR is generated among the plurality commands CMD−3, CMD−2, CMD−1, CMD+1, and CMD+2 applied through the command input pad CMD_PAD, the generation of the error command ERR may notify the semiconductor memory device through a logic level change, and accordingly, the semiconductor memory device may adapt to the error command in such a way as to interrupt its operation or operate continuously by neglecting the error command ERR.

The layout of the clock input pad CLK_PAD, the command input pad CMD_PAD, the address input pad ADDR_PAD, the error determination unit 320, the command delay section 302, the address delay section 304, and the command decoder 340 will be described below with reference back to FIG. 3.

First, the error determination unit 320, the command delay section 302, the address delay section 304, and the command decoder 340 are positioned closer than a first distance to the third and fourth banks BANK2 and BANK3 among the plurality of banks BANK0, BANK1, BANK2, and BANK3 and further than the first distance from the first and second banks BANK0 and BANK1.

The command input pad CMD_PAD is disposed most adjacent to the clock input pad CLK_PAD, which is positioned at the center of the semiconductor memory device. Namely, in the configuration shown in FIG. 3, for example, only the clock input pad CLK_PAD and the command input pad CMD_PAD are disposed at the first distance from the plurality of banks BANK0, BANK1, BANK2, and BANK3.

In this way, as the command delay section 302, the address delay section 304, and the command decoder 340 are disposed adjacent to the error determination unit 320, the error determination unit 320 may quickly and accurately determine whether or not an error has occurred in the input command signal INT_CMD_SIG, and accordingly, the parity operation may be performed.

However, in the configuration shown in FIG. 3 where the command decoder 340 is disposed adjacent to the command delay section 302, the command decoder 340 is positioned closer than the first distance to the third and fourth banks BANK2 and BANK3 among the plurality of banks BANK0, BANK1, BANK2, and BANK3 and further than the first distance from the first and second banks BANK0 and BANK1. This configuration means that the signal DEC_CMD_SIG decoded by the command decoder 340 cannot be transferred to the plurality of respective banks BANK0, BANK1, BANK2, and BANK3 within the same amount of time.

More specifically, in the above-described layout of the semiconductor memory device shown in FIG. 3, when the signal DEC_CMD_SIG decoded by the command decoder 340 is transferred to the plurality of banks BANK0, BANK1, BANK2, and BANK3, a skew may occur. For example, in comparison with when the output signal DEC_CMD_SIG of the command decoder 340 is transferred to the third and fourth banks BANK2 and BANK3 among the plurality of banks BANK0, BANK1, BANK2, and BANK3, which are disposed closer than the first distance from the command decoder 340, when the output signal DEC_CMD_SIG of the command decoder 340 is transferred to the first and second banks BANK0 and BANK1, which are disposed further than the first distance from the command decoder 340, an amount of time two times longer than a time (CLK1→CLK2→CLK3) for the operating clock CLK to be transferred to the command decoder 340 may elapse, which may lead to a corresponding tAA loss.

For reference, tAA of a semiconductor memory device stands for an 'address access delay time' and means a time measured from when an address is inputted along with a read command (RD) to when corresponding data is outputted through a data output pad. Therefore, when the amount of time for a command to be transferred to a bank is lengthened, a tAA loss increases.

Second Embodiment

Figure 6:
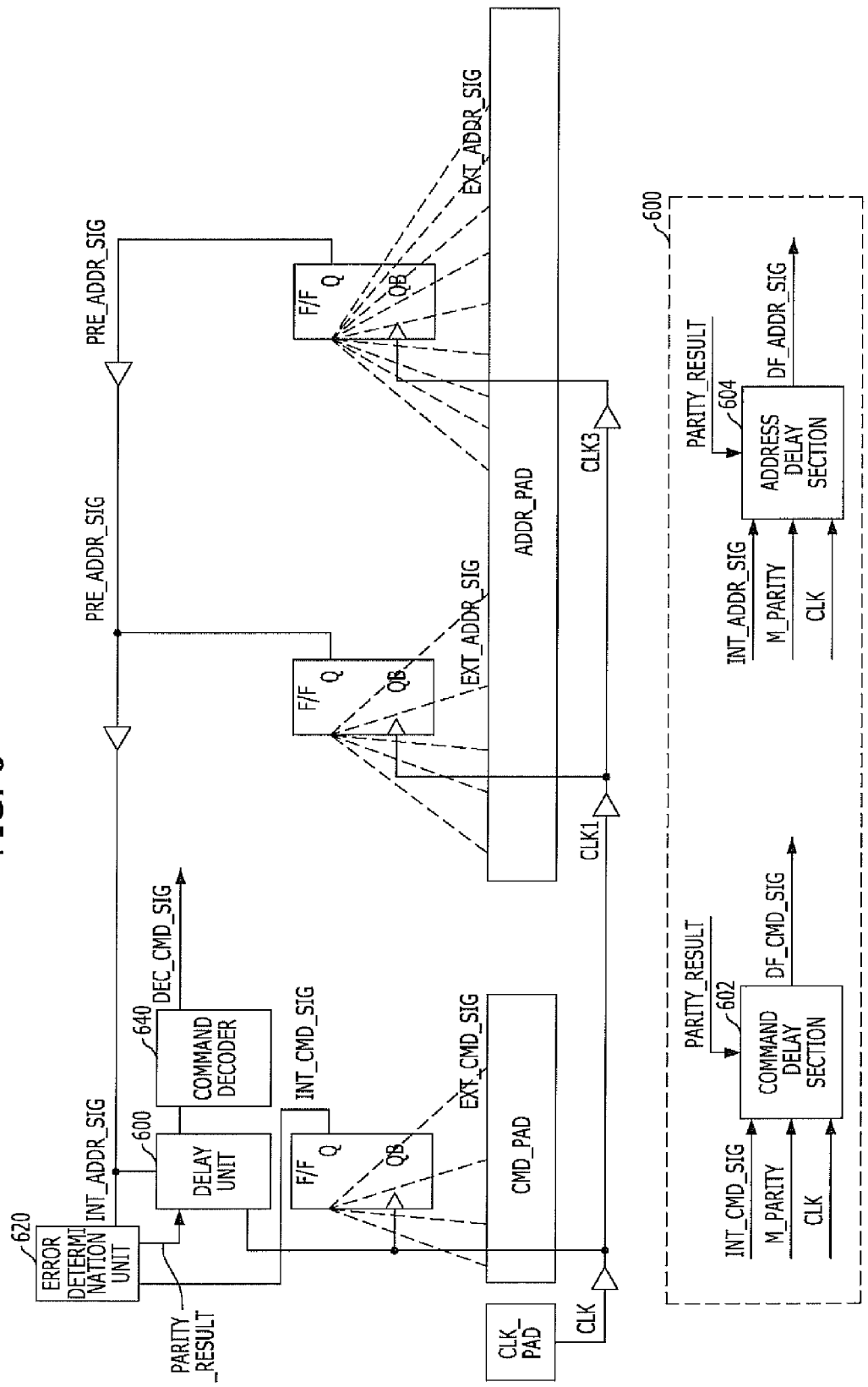
FIG. 6 is a block diagram illustrating a detailed layout of a clock input pad and a second peripheral region in a semiconductor memory device that supports a parity operation in accordance with a second embodiment of the present invention.

FIG. 6 is a block diagram illustrating a detailed layout of a clock input pad and a second peripheral region in a semiconductor memory device that supports a parity operation in accordance with a second embodiment of the present invention.

Figure 7:
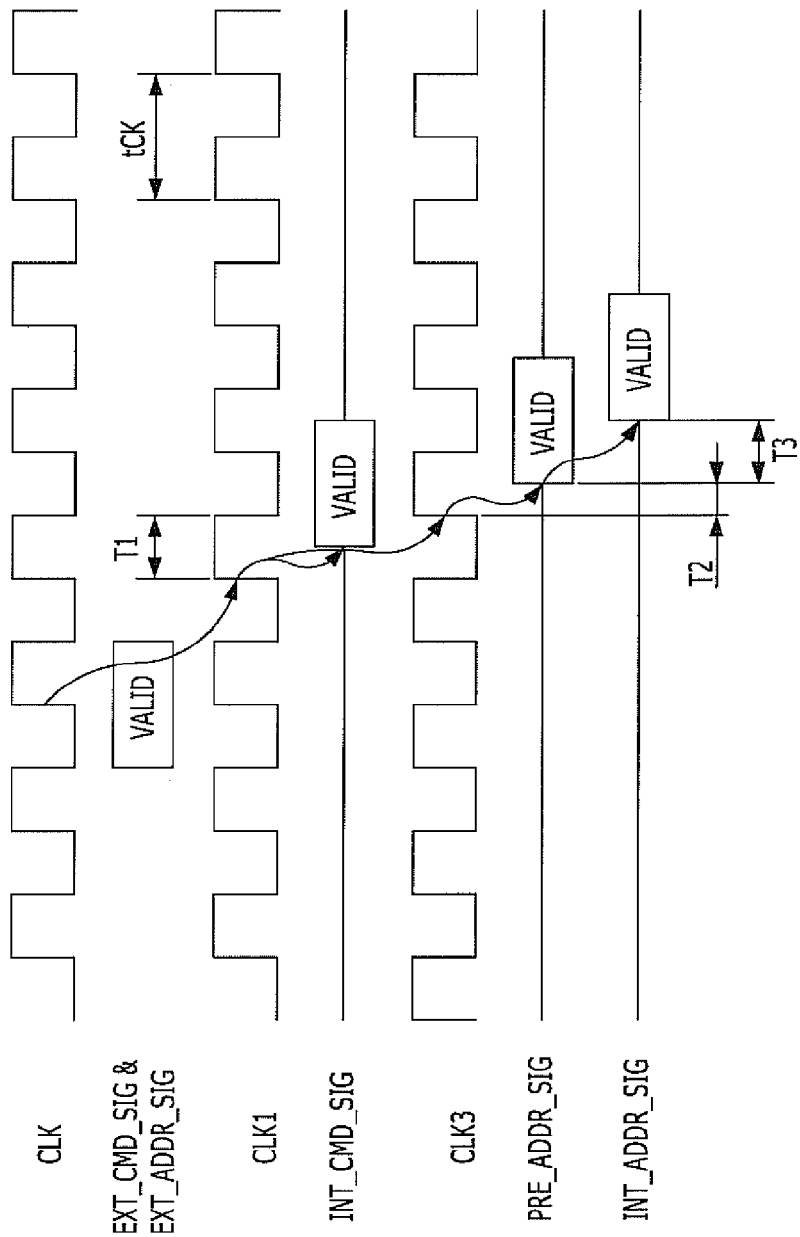
FIG. 7 is a timing diagram illustrating a procedure in which an address signal is transferred, in the semiconductor memory device that supports a parity operation in accordance with the second embodiment of the present invention shown in FIG. 6.

FIG. 7 is a timing diagram illustrating a procedure in which an address signal is transferred in the semiconductor memory device that supports a parity operation in accordance with the second embodiment of the present invention shown in FIG. 6.

In the semiconductor memory device in accordance with the second embodiment of the present invention, the layout configuration between a plurality of banks BANK0, BANK1, BANK2, and BANK3 and peripheral regions DQPERI and ACPERI are the same as shown in FIG. 1. However, as shown in FIG. 6, the layout configuration between a clock input pad CLK_PAD and the second peripheral region ACPERI is different from that shown in FIG. 2.

Furthermore, as explained above, unless it is necessary to distinguish an internal command signal INT_CMD_SIG and an external command signal EXT_CMD_SIG from each other, the internal command signal INT_CMD_SIG and the external command signal EXT_CMD_SIG will not be distinguished from each other in the following descriptions and will be referred to as a command signal INT_CMD_SIG. Similarly, unless it is necessary to specifically distinguish an internal address signal INT_ADDR_SIG and an external address signal EXT_ADDR_SIG from each other, the internal address signal INT_ADDR_SIG and the external address signal EXT_ADDR_SIG will not be distinguished from each other in the following descriptions and will be referred to as an address signal INT_ADDR_SIG.

Referring to FIG. 6, the semiconductor memory device that supports a parity operation in accordance with the second embodiment of the present invention includes a clock input pad CLK_PAD, a command input pad CMD_PAD, an address input pad ADDR_PAD, an error determination unit 620, a delay unit 600, and a command decoder 640.

The delay unit 600 includes a command delay section 602 and an address delay section 604.

The command delay section 602 is configured to delay the command signal INT_CMD_SIG applied through the command input pad CMD_PAD by a first parity delay amount in synchronization with an operating clock CLK and output a parity command signal DF_CMD_SIG in a parity operation mode. The parity operation mode may be a period in which a signal M_PARITY is activated. The operation of the command delay section 602 is controlled in response to an error determination signal PARITY_RESULT.

Also, the command delay section 602 is configured to output the command signal INT_CMD_SIG applied through the command input pad CMD_PAD without delaying the command signal INT_CMD_SIG and output the parity command signal DF_CMD_SIG in a normal operation mode. The normal operation mode may be a period in which the signal M_PARITY is deactivated. More specifically, in the normal operation mode, the command delay section 602 does not perform any operation on the command signal INT_CMD_SIG.

The address delay section 604 is configured to delay the address signal INT_ADDR_SIG applied through the address input pad ADDR_PAD by a second parity delay amount in synchronization with the operating clock CLK and output a parity address signal DF_ADDR_SIG in the parity operation mode. The operation of the address delay section 604 is controlled in response to the error determination signal PARITY_RESULT.

Also, the address delay section 604 is configured to output the address signal INT_ADDR_SIG applied through the address input pad ADDR_PAD without delaying the address signal INT_ADDR_SIG and output the parity address signal DF_ADDR_SIG in the normal operation mode. More specifically, in the normal operation mode, the address delay section 604 does not perform any operation on the address signal INT_ADDR_SIG.

The command decoder 640 is configured to decode the parity command signal DF_CMD_SIG outputted from the command delay section 602 and transfer a resultant signal DEC_CMD_SIG to the plurality of respective banks BANK0, BANK1, BANK2, and BANKS.

The error determination unit 620 is configured to determine whether or not an error has occurred in a plurality of command signals INT_CMD_SIG sequentially applied through the command input pad CMD_PAD and is further configured to decide whether or not to activate the error determination signal PARITY_RESULT. In detail, the error determination unit 620 is configured to receive the address signal INT_ADDR_SIG applied through the address input pad ADDR_PAD and the command signal INT_CMD_SIG applied through the command input pad CMD_PAD and determine whether or not an error has occurred through an error checking operation. The error determination signal PARITY_RESULT, which is activated when an error has occurred, is not synchronized with the operating clock CLK. Since an algorithm for determining whether an error has occurred in the command signal INT_CMD_SIG is known in the art, detailed description thereof will be omitted.

Since the detailed circuits of the command delay section 602 and the address delay section 604 are the same as those shown in FIG. 4 and are described above in accordance with the first embodiment of the present invention, detailed descriptions thereof will be omitted.

Moreover, since operations of the semiconductor memory device that support a parity operation in accordance with the second embodiment of the present invention are the same as those shown in FIG. 5 and are described above in accordance with the first embodiment of the present invention, detailed descriptions thereof will be omitted.

Meanwhile, when observing the layout of the clock input pad CLK_PAD, the command input pad CMD_PAD, the address input pad ADDR_PAD, the error determination unit 620, the command delay section 602, the address delay section 604, and the command decoder 640, which are included in the semiconductor memory device that supports a parity operation in accordance with the second embodiment of the present invention, the layout is different to the layout of the semiconductor memory device that supports a parity operation in accordance with the first embodiment of the present invention.

In detail, the error determination unit 620, the command delay section 602, the address delay section 604, and the command decoder 640 along with the command input pad CMD_PAD are disposed most adjacent to the clock input pad CLK_PAD, which is disposed at the center of the semiconductor memory device. More specifically, the error determination unit 620, the command delay section 602, the address delay section 604, and the command decoder 640 along with the command input pad CMD_PAD are positioned where a first distance is disposed from the plurality of banks BANK0, BANK1, BANK2, and BANKS.

In this way, as the command delay section 602, the address delay section 604, and the command decoder 640 are disposed adjacent to the error determination unit 620, the error determination unit 620 may quickly and accurately determine whether or not an error has occurred in the input command signal INT_CMD_SIG, and accordingly, the parity operation may be performed.

Further, because both the command delay section 602 and the command decoder 640 are disposed most adjacent to the center of the semiconductor memory device, an amount of time elapsed for the signal DEC_CMD_SIG decoded by the command decoder 640 to be transferred to the plurality of respective banks BANK0, BANK1, BANK2, and BANK3 may be the same.

In other words, in the layout of the semiconductor memory device that supports a parity operation, as shown in FIG. 6, when the signal DEC_CMD_SIG decoded by the command decoder 640 is transferred to the plurality of respective banks BANK0, BANK1, BANK2, and BANK3, a skew may not occur, and as a result, a tAA loss may be prevented.

However, as steps for outputting an external address signal EXT_ADDR_SIG applied through the address input pad ADDR_PAD as an internal address signal INT_ADDR_SIG and transferring the internal address signal INT_ADDR_SIG to the address delay section 604 and the error determination unit 620 are implemented as shown in FIG. 7, a parity operation in a semiconductor memory device that operates at a high speed may be difficult to support.

In detail, through times T1 and T2, which elapse until the clock CLK applied through the clock input pad CLK_PAD is transferred to the address input pad ADDR_PAD and the external address signal EXT_ADDR_SIG applied through the address input pad ADDR_PAD is synchronized, a preliminary address signal PRE_ADDR_SIG is outputted.

It can be seen that a time difference between the preliminary address signal PRE_ADDR_SIG outputted in this way and the external address signal EXT_ADDR_SIG is included in one cycle 1tck of the operating clock CLK.

Nevertheless, as a time T3 that elapses for the preliminary address signal PRE_ADDR_SIG to be transferred to the address delay section 604 and the error determination unit 620 and to be outputted as the internal address signal INT_ADDR_SIG is added, a total time exceeds the one cycle 1tck of the operating clock CLK. Namely, a time that elapses for the external address signal EXT_ADDR_SIG to be outputted as the internal address signal INT_ADDR_SIG may be longer than the one cycle 1tck of the operating clock CLK, and in this state, the semiconductor memory device may not normally perform the parity operation.

Of course, in FIG. 7, the time that elapses for the external address signal EXT_ADDR_SIG to be outputted as the internal address signal INT_ADDR_SIG may exceed the one cycle 1tck of the operating clock CLK since the time T1 for the clock CLK applied through the clock input pad CLK_PAD to be transferred to the address input pad ADDR_PAD and the added time T3 for the preliminary address signal PRE_ADDR_SIG to be transferred to the address delay section 604 and the error determination unit 620 are set to maximum values. Nonetheless, when considering that one cycle 1tck of the operating clock CLK is shortened in the case of a semiconductor memory device operating at a high speed, if the configuration for supporting a parity operation that has the layout shown in FIG. 6 is applied to the semiconductor memory device operating at a high speed, the stability of the parity operation is likely to deteriorate.

Third Embodiment

Figure 8:
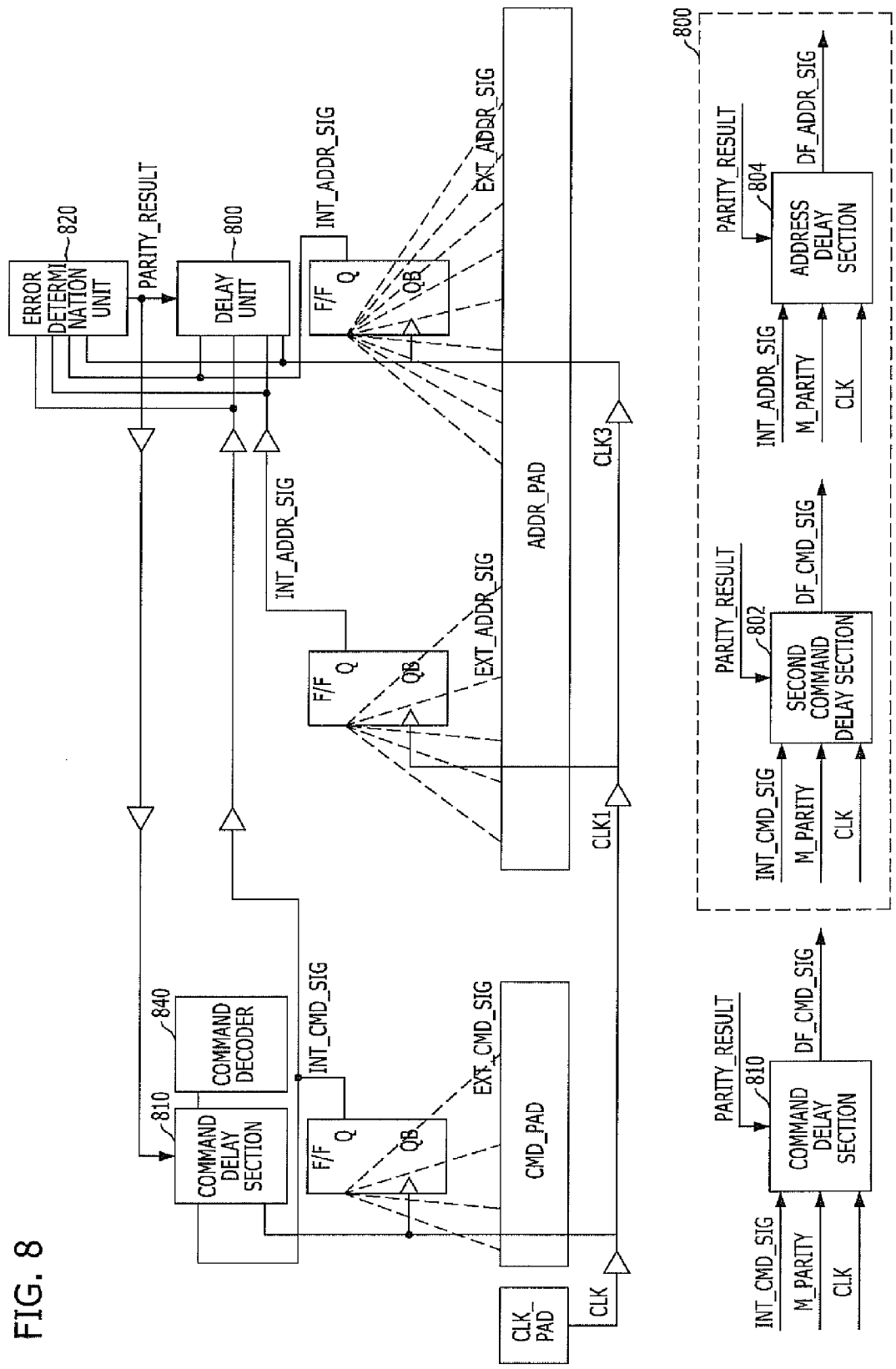
FIG. 8 is a block diagram illustrating a detailed layout of a clock input pad and a second peripheral region in a semiconductor memory device that supports a parity operation in accordance with a third embodiment of the present invention.

FIG. 8 is a block diagram illustrating a detailed layout of a clock input pad and a second peripheral region in a semiconductor memory device that supports a parity operation in accordance with a third embodiment of the present invention.

Figure 9:
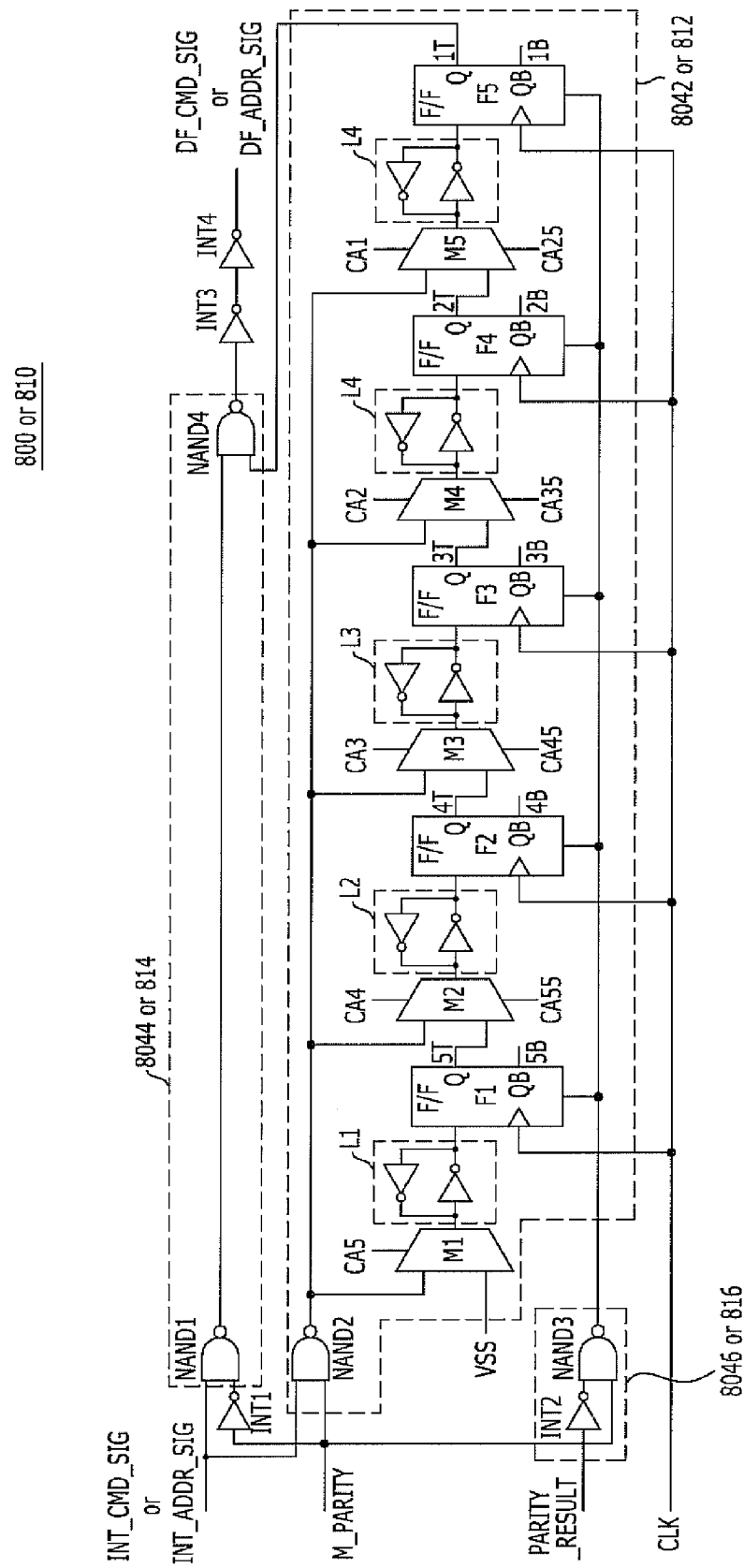
FIG. 9 is a circuit diagram show illustrating in detail a command delay section and an address delay section among the component elements of the semiconductor memory device that supports a parity operation in accordance with the third embodiment of the present invention shown in FIG. 8.

FIG. 9 is a circuit diagram illustrating in detail a command delay section and an address delay section among the component elements of the semiconductor memory device that supports a parity operation in accordance with the third embodiment of the present invention shown in FIG. 8.

Figure 10:
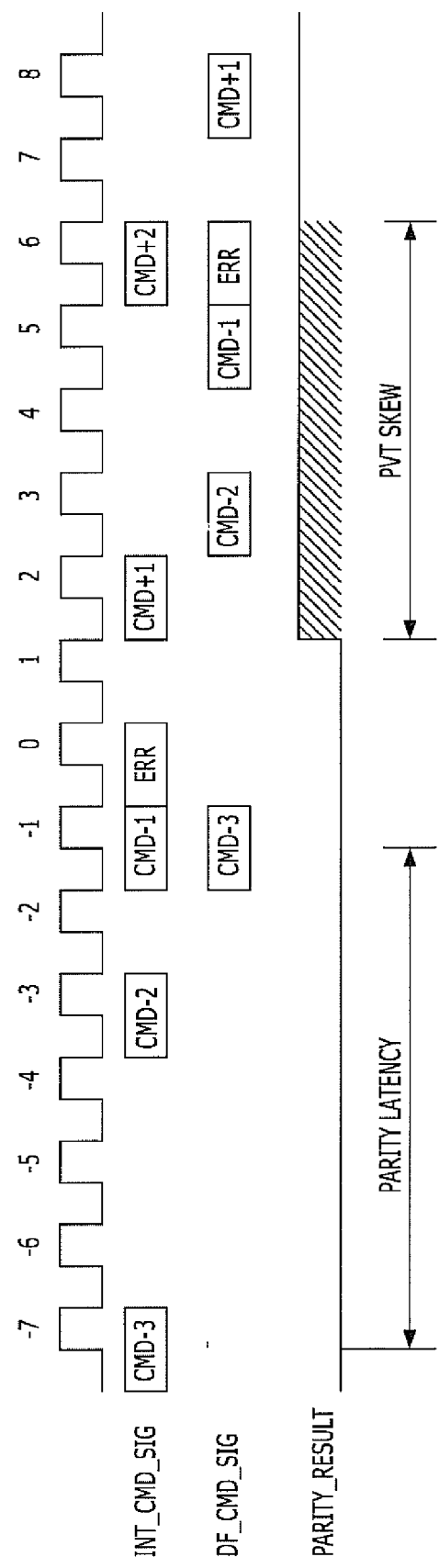
FIG. 10 is a timing diagram illustrating operations of the semiconductor memory device that supports a parity operation in accordance with the third embodiment of the present invention shown in FIG. 8.

FIG. 10 is a timing diagram illustrating operations of the semiconductor memory device that supports a parity operation in accordance with the third embodiment of the present invention shown in FIG. 8.

In the semiconductor memory device in accordance with the third embodiment of the present invention, the layout configuration between a plurality of banks BANK0, BANK1, BANK2, and BANK3 and peripheral regions DQPERI and ACPERI are the same as shown in FIG. 1. However, shown in FIG. 8, the layout configuration between a clock input pad CLK_PAD and the second peripheral region ACPERI is different from that shown in FIG. 2.

Furthermore, as explained above, unless it is necessary to distinguish an internal command signal INT_CMD_SIG and an external command signal EXT_CMD_SIG from each other, the internal command signal INT_CMD_SIG and the external command signal EXT_CMD_SIG will not be distinguished from each other in the following descriptions and will be referred to as a command signal INT_CMD_SIG. Similarly, unless it is necessary to specifically distinguish an internal address signal INT_ADDR_SIG and an external address signal EXT_ADDR_SIG from each other, the internal address signal INT_ADDR_SIG and the external address signal EXT_ADDR_SIG will not be distinguished from each other in the following descriptions and will be referred to as an address signal INT_ADDR_SIG.

Referring to FIG. 8, the semiconductor memory device that supports a parity operation in accordance with the third embodiment of the present invention includes a clock input pad CLK_PAD, a command input pad CMD_PAD, an address input pad ADDR_PAD, an error determination unit 820, a delay unit 800, a command decoder 840, and a command delay section 810. The delay unit 800 may include, for example, only an address delay section 804, unlike the illustration of FIG. 8, or may be configured to include a second command delay section 802 and an address delay section 804 as shown in FIG. 8.

The command delay section 810 is configured to delay the command signal INT_CMD_SIG applied through the command input pad CMD_PAD by a first parity delay amount in synchronization with an operating clock CLK and output a parity command signal DF_CMD_SIG in a parity operation mode. The parity operation mode may be a period in which a signal M_PARITY is activated. The operation of the command delay section 810 is controlled in response to an error determination signal PARITY_RESULT.

Also, the command delay section 810 is configured to output the command signal INT_CMD_SIG applied through the command input pad CMD_PAD without delaying the command signal INT_CMD_SIG and output the parity command signal DF_CMD_SIG in a normal operation mode. The normal operation mode may be a period in which the signal M_PARITY is deactivated. More specifically, in the normal operation mode, the command delay section 810 does not perform any operation on the command signal INT_CMD_SIG.

The second command delay section 802 is configured to latch the command signal INT_CMD_SIG applied through the command input pad CMD_PAD during a period corresponding to the parity delay amount in the parity operation mode. The operation of the second command delay section 802 is controlled in response to the error determination signal PARITY_RESULT.

Also, the second command delay section 802 is configured not to latch the command signal INT_CMD_SIG applied through the command input pad CMD_PAD in the normal operation mode.

Such a second command delay section 802 serving as a dummy of the command delay section 810 latches a plurality of command signals INT_CMD_SIG sequentially applied through the command input pad CMD_PAD in a shifting pattern in the parity operation mode and is on/off controlled in the operation thereof in response to the error determination signal PARITY_RESULT. Whether to output the latched command signal INT_CMD_SIG is controlled in response to an output control signal (not shown).

The second command delay section 802 described above may be excluded in the configuration of FIG. 8 because the second command delay section 802 latches a designated number of command signals INT_CMD_SIG in the parity operation mode.

The address delay section 804 is configured to delay the address signal INT_ADDR_SIG applied through the address input pad ADDR_PAD by a second parity delay amount in synchronization with the operating clock CLK and output a parity address signal DF_ADDR_SIG in the parity operation mode. The operation of the address delay section 804 is controlled in response to the error determination signal PARITY_RESULT.

Also, the address delay section 804 is configured to output the address signal INT_ADDR_SIG applied through the address input pad ADDR_PAD without delaying the address signal INT_ADDR_SIG and output the parity address signal DF_ADDR_SIG in the normal operation mode. More specifically, in the normal operation mode, the address delay section 804 does not perform any operation on the address signal INT_ADDR_SIG.

The command decoder 840 is configured to decode the parity command signal DF_CMD_SIG outputted from the command delay section 810 and transfer a resultant signal DEC_CMD_SIG to the plurality of respective banks BANK0, BANK1, BANK2, and BANK3.

The error determination unit 820 is configured to determine whether or not an error has occurred in a plurality of command signals INT_CMD_SIG sequentially applied through the command input pad CMD_PAD and is further configured to decide whether or not to activate the error determination signal PARITY_RESULT. In detail, the error determination unit 820 is configured to receive with the address signal INT_ADDR_SIG applied through the address input pad ADDR_PAD and the command signal INT_CMD_SIG applied through the command input pad CMD_PAD and determine whether or not an error has occurred through an error checking operation. The error determination signal PARITY_RESULT, which is activated when an error has occurred, is not synchronized with the operating clock CLK. Since an algorithm for determining whether an error has occurred in the command signal INT_CMD_SIG applied through the command input pad CMD_PAD is known in the art, detailed description thereof will be omitted.

Referring to FIG. 9, detailed circuit configurations of the command delay section 810 and the address delay section 804 are illustrated.

In detail, the command delay section 810 includes a stepwise command delay stage 812, a command bypass stage 814, and a command output control stage 816. The stepwise command delay stage 812 is configured to delay the plurality of command signals INT_CMD_SIG sequentially applied through the command input pad CMD_PAD by parity delay amounts in a stepwise FIFO (first in first out) pattern corresponding to the toggling of the operating clock CLK in the parity operation mode. The command bypass stage 814 is configured to bypass the command signals INT_CMD_SIG applied through the command input pad CMD_PAD in the normal operation mode. In addition, the command operation control stage 816 is configured to control the operation of the stepwise command delay stage 812 in response to the error determination signal PARITY_RESULT in the parity operation mode.

The stepwise command delay stage 812 includes a plurality of command delay flip-flops F1, F2, F3, F4, and F5, command input selection parts M1, M2, M3, M4, and M5, and a plurality of command latches L1, L2, L3, L4, and L5. The plurality of command delay flip-flops F1, F2, F3, F4, and F5 delay the signals applied thereto by one cycle 1tck during the activation period of the output signal of the command operation control stage 816, output resultant signals, and are connected in a chain type. The command input selection parts M1, M2, M3, M4, and M5 apply the plurality of command signals INT_CMD_SIG sequentially applied thereto through the command input pad CMD_PAD to any one of the plurality of command delay flip-flops F1, F2, F3, F4, and F5 in response to parity delay amount setting signals CA5, CA4, CA3, CA2, and CA1. The plurality of command latches L1, L2, L3, L4, and L5 are respectively connected to the input terminals of the plurality of command delay flip-flops F1, F2, F3, F4, and F5 and latch the signals applied thereto through the command input selection parts M1, M2, M3, M4 and M5. Moreover, the stepwise command delay stage 812 further includes a NAND gate NAND2. The NAND gate NAND2 transfers the command signal INT_CMD_SIG applied in the parity operation mode to the command input selection parts M1, M2, M3, M4, and M5 and does not transfer the command signal INT_CMD_SIG applied in the normal operation mode to the command input selection parts M1, M2, M3, M4, and M5.

The command bypass stage 814 includes a first NAND gate NAND1 and a second NAND gate NAND3. The first NAND gate NAND1 transfers the command signal INT_CMD_SIG as it is in the normal operation mode and outputs a signal activated to a logic high level regardless of the command signal INT_CMD_SIG in the parity operation mode. The second NAND gate NAND3 is inputted with the output signal of the first NAND gate NAND1 and the output signal of the stepwise command delay stage 812, performs a NAND operation, and outputs a resultant signal to the command output control stage 816. Further, two inverters INT3 and INT4 are connected to the output terminal of the second NAND gate NAND4 to maintain and output the logic level of the parity command signal DF_CMD_SIG outputted from the second NAND gate NAND4.

The command operation control stage 816 includes an inverter INT2 and a NAND gate NAND3 that turn off operations of the plurality of command delay flip-flops F1, F2, F3, F4, and F5 when the error determination signal PARITY_RESULT is activated to a logic high level and turns on operations of the plurality of command delay flip-flops F1, F2, F3, F4 and F5 when the error determination signal PARITY_RESULT is deactivated to a logic low level in the parity operation mode.

The address delay section 804 includes a stepwise address delay stage 8042, a command bypass stage 8044, and a command output control stage 8046. The stepwise command delay stage 8042 is configured to delay the plurality of address signals INT_ADDR_SIG sequentially applied through the address input pad ADDR_PAD by parity delay amounts in a stepwise FIFO (first in first out) pattern corresponding to the toggling of the operating clock CLK in the parity operation mode The address bypass stage 8044 is configured to output the address signals INT_ADDR_SIG applied through the address input pad ADDR_PAD in the normal operation mode. In addition, the address operation control stage 8046 configured to control the operation of the stepwise address delay stage 8042 in response to the error determination signal PARITY_RESULT in the parity operation mode.

The stepwise address delay stage 8042 includes a plurality of address delay flip-flops F1, F2, F3, F4, and F5, address input selection parts M1, M2, M3, M4, and M5, and a plurality of address latches L1, L2, L3, L4 and L5. The plurality of address delay flip-flops F1, F2, F3, F4, and F5 delay the signals applied thereto by one cycle 1tck during the activation period of the output signal of the address operation control stage 8046, output resultant signals, and are connected in a chain type. The address input selection parts M1, M2, M3, M4, and M5 apply the plurality of address signals INT_ADDR_SIG sequentially applied thereto through the address input pad ADDR_PAD to any one of the plurality of address delay flip-flops F1, F2, F3, F4, and F5 in response to parity delay amount setting signals CA5, CA4, CA3, CA2, and CA1. In addition, the plurality of address latches L1, L2, L3, L4, and L5 are respectively connected to the input terminals of the plurality of address delay flip-flops F1, F2, F3, F4, and F5 and latch the signals applied thereto through the address input selection parts M1, M2, M3, M4 and M5.

Moreover, the stepwise address delay stage 8042 further includes a NAND gate NAND2. The NAND gate NAND2 transfers the address signal INT_ADDR_SIG applied in the parity operation mode to the address input selection parts M1, M2, M3, M4, and M5 and does not transfer the address signal INT_ADDR_SIG applied in the normal operation mode to the address input selection parts M1, M2, M3, M4, and M5.

The address bypass stage 8044 includes a first NAND gate NAND1 and a second NAND gate NAND3. The first NAND gate NAND1 transfers the address signal INT_ADDR_SIG as it is in the normal operation mode and outputs a signal activated to a logic high level regardless of the address signal INT_ADDR_SIG in the parity operation mode. The second NAND gate NAND3 receives the output signal of the first NAND gate NAND1 and the output signal of the stepwise address delay stage 8042, performs a NAND operation, and outputs a resultant signal. Further, two inverters INT3 and INT4 are connected to the output terminal of the second NAND gate NAND4 to maintain and output the logic level of the parity address signal DF_ADDR_SIG outputted from the second NAND gate NAND4.

The command operation control stage 8046 includes an inverter INT2 and a NAND gate NAND3 that turn off operations of the plurality of address delay flip-flops F1, F2, F3, F4, and F5 when the error determination signal PARITY_RESULT is activated to a logic high level and turns on operations of the plurality of address delay flip-flops F1, F2, F3, F4, and F5 when the error determination signal PARITY_RESULT is deactivated to a logic low level in the parity operation mode.

For reference, the values of the parity delay amount setting signals CA5, CA4, CA3, CA2, and CA1 may be set by a designer through a component element, which may be included in a semiconductor memory device, such as a memory register set (MRS). In other words, the parity delay amounts of the command delay section 810 and the address delay section 804 may be set by a designer.

Further, the detailed configuration of second command delay section 802 completely corresponds to that of the command delay section 810. However, because the second command delay section 802 is provided to latch the command signals INT_CMD_SIG during a period corresponding to the parity delay amount, a configuration for outputting the command signal INT_CMD_SIG latched by the second command delay section 802 in response to an output control signal through a component element which may be included in a semiconductor memory device, such as a memory register set (MRS), may be additionally provided.

Referring to FIG. 10, operations of the semiconductor memory device that support a parity operation in accordance with the third embodiment of the present invention are illustrated.

In detail, if the parity operation mode is entered, the command delay section 810 delays the command signal INT_CMD_SIG by the parity delay amount and outputs the parity command signal DF_CMD_SIG.

As shown in FIG. 10, as the command signal INT_CMD_SIG and a plurality of commands CMD−3, CMD−2, CMD−1, CMD+1, and CMD+2 are sequentially inputted, and the parity command signal DF_CMD_SIG and a plurality of commands CMD−3, CMD−2, CMD−1, CMD+1, and CMD+2 are sequentially generated.

For reference, if the operation for delaying the command signal INT_CMD_SIG by the parity delay amount and outputting the parity command signal DF_CMD_SIG is performed by the command delay section 810, the second command delay section 802 stores the command signal INT_CMD_SIG inputted during the period corresponding to the parity delay amount. For example, during a period in which the command CMD−3 inputted first among the plurality of sequential commands CMD−3, CMD−2, CMD−1, CMD+1, and CMD+2 is applied and delayed by the parity delay amount, the second and third inputted commands CMD−2 and CMD−1 are applied, and the second command delay section 802 latches the second and third inputted commands CMD−2 and CMD−1 until the error determination unit 820 determines that the first inputted command CMD−3 is not an error command.

At this time, the command applied next after the command CMD−1 applied third among the plurality of commands CMD−3, CMD−2, CMD−1, CMD+1, and CMD+2, which are sequentially inputted, becomes an error command ERR. Therefore, the error determination unit 820 detects the command, determines that the command is the error command ERR, and immediately activates the error determination signal PARITY_RESULT from a logic low level to a logic high level. In this way, the error determination unit 820 may detect that a command input error has occurred in the semiconductor memory device.

At this time, since the point in time when the error determination signal PARITY_RESULT is determined is not synchronized with the operating clock CLK, the activation time of the error determination signal PARITY_RESULT may be changed according to variations in PVT (process, voltage, and temperature). Namely, the length of a period from a point in time when the error command ERR has occurred to a point in time when the error determination signal PARITY_RESULT is activated may be changed according to variations in PVT.

For example, where an operation is performed under a good condition with no substantial variations in PVT, the error determination signal PARITY_RESULT is activated immediately after the error command ERR is applied and before the next command CMD+1 is applied. Where an operation is performed under a bad condition with substantial variations in PVT, the error determination signal PARITY_RESULT is activated after the error command ERR is applied and after several commands CMD+1 and CMD+2 are additionally applied.

As described above, the semiconductor memory device in accordance with the third embodiment of the present invention shown in FIGS. 8 to 10 may support the parity operation. As a consequence, when the error command ERR is generated among the plurality commands CMD−3, CMD−2, CMD−1, CMD+1, and CMD+2 applied through the command input pad CMD_PAD, the generation of the error command ERR may notify to the semiconductor memory device through a logic level change, and accordingly, the semiconductor memory device may adapt to the error command in such a way as to interrupt its operation or operate continuously by neglecting the error command ERR.

As shown in FIG. 8, the layout according to the present embodiment takes advantage of the layout of the semiconductor memory device that supports a parity operation in accordance with the first embodiment of the present invention and the advantages of the layout of the semiconductor memory device that supports a parity operation in accordance with the second embodiment of the present invention.

In detail, the command delay section 810 and the command decoder 840 along with the command input pad CMD_PAD are disposed most adjacent to the clock input pad CLK_PAD, which is positioned at the center of the semiconductor memory device. More specifically, the command delay section 810 and the command decoder 840 along with the command input pad CMD_PAD are disposed at the first distance from the plurality of respective banks BANK0, BANK1, BANK2, and BANK3.

Further, the error determination unit 820 and the address delay section 804 included in the delay unit 800 are disposed adjacent to the address input pad ADDR_PAD. In other words, the error determination unit 820 and the address delay section 804 are disposed closer than the first distance to the third and fourth banks BANK2 and BANK3 among the plurality of banks BANK0, BANK1, BANK2, and BANK3 and further than the first distance from the first and second banks BANK0 and BANK1.

In this way, as the address delay section 804 and the address input pad ADDR_PAD are disposed adjacent to the error determination unit 820, the error determination unit 820 may quickly and accurately determine whether or not an error has occurred in the input command signal INT_CMD_SIG, and accordingly, the parity operation may be efficiently performed.

Moreover, because both the command delay section 810 and the command decoder 840 are disposed most adjacent to the center of the semiconductor memory device, an amount of time for the signal DEC_CMD_SIG decoded by the command decoder 840 to be transferred to the plurality of respective banks BANK0, BANK1, BANK2, and BANK3 may be the same.

Namely, in the layout of the semiconductor memory device shown in FIG. 8 that supports a parity operation, when the signal DEC_CMD_SIG decoded by the command decoder 840 is transferred to the plurality of respective banks BANK0, BANK1, BANK2, and BANK3, a skew may not occur, and a tAA loss may be prevented.

Further, in the above-described layout of the semiconductor memory device shown in FIG. 8 that supports a parity operation, since the amount of time from when the external address EXT_ADDR_SIG applied through the address input pad ADDR_PAD is outputted as the internal address signal INT_ADDR_SIG to when the internal address signal INT_ADDR_SIG is transferred to the address delay section 804 and the error determination unit 820 may be shortened, a semiconductor memory device may support the parity operation even when operating at a high speed. Accordingly, the parity operation may be performed even in the semiconductor memory device operating at a high speed.

As is apparent from the above descriptions, according to the embodiments of the present invention, the parity operation may be supported in the semiconductor memory device when an error is determined to have occurred in the command signal INT_CMD_SIG applied through the command input pad CMD_PAD.

Also, since a command decoder for decoding the command signal INT_CMD_SIG and transferring a resultant signal to the plurality of banks BANK0, BANK1, BANK2, and BANK3 is disposed at the center of the semiconductor memory device, the plurality of banks BANK0, BANK1, BANK2, and BANK3 included in the semiconductor memory device may perform the parity operation without the occurrence of a skew, and also, without the loss of tAA.

Furthermore, because a component element for determining whether an error occurs in the command signal INT_CMD_SIG is always disposed at a position adjacent to the address input pad ADDR_PAD, the parity operation may be supported without a limitation in the frequency of the operating clock CLK, and thus may be performed at a high speed.

While the present invention has been described with respect to the specific embodiments, it will be apparent to those skilled in the art that various changes and modifications may be made without departing from the spirit and scope of the invention as defined in the following claims.

For example, the positions and kinds of the logic gates and transistors exemplified in the aforementioned embodiments may be differently realized depending upon the polarities of signals inputted thereto.

What is claimed is:

1. A semiconductor memory device comprising:
   a command delay section configured to delay a command signal applied through a command input pad by a parity delay amount in synchronization with an operating clock and output a parity command signal in a parity operation mode, wherein the command delay section is further configured to be controlled in response to an error determination signal;
   a command decoder configured to decode the parity command signal and transfer a resultant signal to a plurality of memory banks; and
   an error determination unit configured to determine whether an error has occurred in the command signal and generate an error determination signal.

2. The semiconductor memory device of claim 1, further comprising:
   an address delay section configured to delay an address signal applied through an address input pad by the parity delay amount and output a parity address signal in the parity operation mode, wherein the address delay section is further configured to be controlled in response to the error determination signal.

3. The semiconductor memory device of claim 2,
   wherein the command delay section, the command decoder, and the command input pad are disposed adjacent to one another and disposed at a first distance from the plurality of respective memory banks, and
   wherein the address delay section, the error determination unit, and the address input pad are disposed adjacent to one another and disposed closer than the first distance to a first group of memory banks of the plurality of memory banks and further than the first distance from a second group of memory banks not included in the first group.

4. The semiconductor memory device of claim 3,
   wherein the command delay section does not delay the command signal applied through the command input pad and outputs the parity command signal in a normal operation mode, and wherein the address delay section does not delay the address signal applied through the address input pad and outputs the parity address signal in the normal operation mode.

5. The semiconductor memory device of claim 4, wherein the command delay section comprises:
a stepwise command delay stage configured to delay a plurality of command signals sequentially applied through the command input pad by the parity delay amount in a stepwise FIFO (first in first out) pattern corresponding to a toggling of the operating clock in the parity operation mode;
a command bypass stage configured to bypass the command signals applied through the command input pad in the normal operation mode; and
a command operation control stage configured to control an operation of the stepwise command delay stage in response to the error determination signal in the parity operation mode.

6. The semiconductor memory device of claim 5, wherein the stepwise command delay stage comprises:
a plurality of command delay flip-flops configured to delay signals applied thereto by one cycle of the operating clock and output resultant signals during a period in which an output signal of the command operation control stage is activated, wherein the plurality of command delay flip-flops are connected in a chain type;
command input selection parts configured to apply the plurality of command signals sequentially applied through the command input pad to any one of the plurality of command delay flip-flops in response to parity delay amount setting signals; and
a plurality of command latches configured to latch signals applied through the command input selection parts, wherein the plurality of command latches are respectively connected to input terminals of the plurality of command delay flip-flops.

7. The semiconductor memory device of claim 4, wherein the address delay section comprises:
a stepwise address delay stage configured to delay a plurality of address signals sequentially applied through the address input pad by the parity delay amount in a stepwise FIFO (first in first out) pattern corresponding to a toggling of the operating clock in the parity operation mode;
an address bypass stage configured to bypass the address signals applied through the address input pad in the normal operation mode; and
an address operation control stage configured to control an operation of the stepwise address delay stage in response to the error determination signal in the parity operation mode.

8. The semiconductor memory device of claim 7, wherein the stepwise address delay stage comprises:
a plurality of address delay flip-flops configured to delay signals applied thereto by one cycle of the operating clock and output resultant signals during a period in which an output signal of the address operation control stage is activated, wherein the plurality of address delay flip-flops are connected in a chain type;
address input selection parts configured to apply the plurality of address signals sequentially applied through the address input pad to any one of the plurality of address delay flip-flops in response to parity delay amount setting signals; and
a plurality of address latches configured to latch signals applied through the address input selection parts, wherein the plurality of address latches are respectively connected to input terminals of the plurality of address delay flip-flops.

9. The semiconductor memory device of claim 4, wherein each of the plurality of memory banks comprises an address decoder configured to receive and decode the address signal applied through the address delay section.

10. The semiconductor memory device of claim 3, further comprising:
a second command delay section configured to latch the command signal applied through the command input pad during a period corresponding to the parity delay amount in the parity operation mode and controlled in response to the error determination signal, wherein the second command delay section is disposed adjacent to the address delay section, the error determination unit, and the address input pad, and disposed closer than the first distance to the first group memory banks among the plurality of memory banks and further than the first distance from a second group of memory banks not included in the first group.

11. The semiconductor memory device of claim 10, wherein the second command delay section does not latch the command signal applied through the command input pad in the normal operation mode.

12. The semiconductor memory device of claim 11,
wherein the second command delay section is configured to serve as a dummy delay section of the command delay section and latch in a shifting pattern the plurality of command signals sequentially applied through the command input pad during the period corresponding to the parity delay amount in the parity operation mode, and is controlled in response to the error determination signal, and
wherein whether to output a latched signal is controlled in response to an output control signal.

13. The semiconductor memory device of claim 2,
wherein the command input pad is disposed at a first distance from the plurality of respective memory banks, and
wherein the command delay section, the command decoder, the address delay section, the error determination unit, and the address input pad are disposed adjacent to one another and disposed closer than the first distance to a first group of memory banks of the plurality of memory banks and further than the first distance from a second group of memory banks not included in the first group.

14. The semiconductor memory device of claim 2,
wherein the command delay section, the command decoder, the address delay section, the error determination unit and the command input pad are disposed adjacent to one another and disposed at the first distance from the plurality of respective memory banks, and
wherein the address input pad is disposed closer than the first distance to the first group of memory banks of the plurality of memory banks and further than the first distance from the second group memory banks.

15. The semiconductor memory device of claim 13,
wherein the command delay section does not delay the command signal applied through the command input pad and outputs the parity command signal in a normal operation mode, and
wherein the address delay section does not delay the address signal applied through the address input pad and outputs the parity address signal in the normal operation mode.

16. The semiconductor memory device of claim 15, wherein the command delay section comprises:
- a stepwise command delay stage configured to delay a plurality of command signals sequentially applied through the command input pad by the parity delay amount in a stepwise FIFO (first in first out) pattern corresponding to a toggling of the operating clock in the parity operation mode;
- a command bypass stage configured to bypass the command signals applied through the command input pad in the normal operation mode; and
- a command output control stage configured to set the parity command signal to a designated value regardless of a value of a signal outputted from the stepwise command delay stage in response to the error determination signal.

17. The semiconductor memory device of claim 16, wherein the stepwise command delay stage comprises:
- a plurality of command delay flip-flops configured to delay signals applied thereto by one cycle of the operating clock and output resultant signals, wherein the plurality of command delay flip-flops are connected in a chain type;
- command input selection parts configured to apply the plurality of command signals sequentially applied through the command input pad to any one of the plurality of command delay flip-flops in response to parity delay amount setting signals; and
- a plurality of command latches configured to latch signals applied through the command input selection parts, wherein the plurality of command latches are respectively connected to input terminals of the plurality of command delay flip-flops.

18. The semiconductor memory device of claim 15, wherein the address delay section comprises:
- a stepwise address delay stage configured to delay a plurality of address signals sequentially applied through the address input pad by the parity delay amount in a stepwise FIFO (first in first out) pattern corresponding to the toggling of the operating clock in the parity operation mode;
- an address bypass stage configured to bypass the address signals applied through the address input pad in the normal operation mode; and
- an address output control stage configured to set the parity address signal to a designated value regardless of a value of a signal outputted from the stepwise address delay stage in response to the error determination signal.

19. The semiconductor memory device of claim 18, wherein the stepwise address delay stage comprises:
- a plurality of address delay flip-flops configured to delay signals applied thereto by one cycle of the operating clock and output resultant signals, wherein the plurality of address delay flip-flops are connected in a chain type;
- address input selection parts configured to apply the plurality of address signals sequentially applied through the address input pad to any one of the plurality of address delay flip-flops in response to parity delay amount setting signals; and
- a plurality of address latches configured to latch signals applied through the address input selection parts, wherein the plurality of address latches are respectively connected to input terminals of the plurality of address delay flip-flops.

20. The semiconductor memory device of claim 2, wherein the error determination unit is inputted with the address signal and the command signal and determines whether or not an error has occurred in the command signal through an error checking operation, and
wherein an activation time of the error determination signal corresponding to whether or not an error has occurred is not synchronized with the operating clock.

21. The semiconductor device of claim 4,
wherein the normal operation mode is a period in which a parity signal is deactivated, and
wherein the parity operation mode is a period in which the parity signal is activated.

22. The semiconductor memory device of claim 14,
wherein the command delay section does not delay the command signal applied through the command input pad and outputs the parity command signal in a normal operation mode, and
wherein the address delay section does not delay the address signal applied through the address input pad and outputs the parity address signal in the normal operation mode.

23. The semiconductor memory device of claim 22, wherein the command delay section comprises:
- a stepwise command delay stage configured to delay a plurality of command signals sequentially applied through the command input pad by the parity delay amount in a stepwise FIFO (first in first out) pattern corresponding to a toggling of the operating clock in the parity operation mode;
- a command bypass stage configured to bypass the command signals applied through the command input pad in the normal operation mode; and
- a command output control stage configured to set the parity command signal to a designated value regardless of a value of a signal outputted from the stepwise command delay stage in response to the error determination signal.

24. The semiconductor memory device of claim 23, wherein the stepwise command delay stage comprises:
- a plurality of command delay flip-flops configured to delay signals applied thereto by one cycle of the operating clock and output resultant signals, wherein the plurality of command delay flip-flops are connected in a chain type;
- command input selection parts configured to apply the plurality of command signals sequentially applied through the command input pad to any one of the plurality of command delay flip-flops in response to parity delay amount setting signals; and
- a plurality of command latches configured to latch signals applied through the command input selection parts, wherein the plurality of command latches are respectively connected to input terminals of the plurality of command delay flip-flops.

25. The semiconductor memory device of claim 22, wherein the address delay section comprises:
- a stepwise address delay stage configured to delay a plurality of address signals sequentially applied through the address input pad by the parity delay amount in a stepwise FIFO (first in first out) pattern corresponding to the toggling of the operating clock in the parity operation mode;
- an address bypass stage configured to bypass the address signals applied through the address input pad in the normal operation mode; and
- an address output control stage configured to set the parity address signal to a designated value regardless of a value of a signal outputted from the stepwise address delay stage in response to the error determination signal.

26. The semiconductor memory device of claim 25, wherein the stepwise address delay stage comprises:
- a plurality of address delay flip-flops configured to delay signals applied thereto by one cycle of the operating clock and output resultant signals, wherein the plurality of address delay flip-flops are connected in a chain type;
- address input selection parts configured to apply the plurality of address signals sequentially applied through the address input pad to any one of the plurality of address delay flip-flops in response to parity delay amount setting signals; and
- a plurality of address latches configured to latch signals applied through the address input selection parts, wherein the plurality of address latches are respectively connected to input terminals of the plurality of address delay flip-flops.

* * * * *